United States Patent [19]
Koike et al.

[11] Patent Number: 5,671,174
[45] Date of Patent: Sep. 23, 1997

[54] FERROELECTRIC MEMORY DEVICE

[75] Inventors: Hiroki Koike; Tohru Kimura, both of Tokyo, Japan

[73] Assignee: NEC Corporation, Tokyo, Japan

[21] Appl. No.: 575,078

[22] Filed: Dec. 19, 1995

[30] Foreign Application Priority Data

Dec. 27, 1994 [JP] Japan .................... 6-324558

[51] Int. Cl.$^6$ .................... G11C 11/22
[52] U.S. Cl. .................... 365/145; 365/149; 365/203
[58] Field of Search .................... 365/145, 149, 365/203, 210

[56] References Cited

U.S. PATENT DOCUMENTS

| | | | |
|---|---|---|---|
| 5,455,786 | 10/1995 | Takeuchi et al. | 365/145 |
| 5,467,302 | 11/1995 | Hirano et al. | 365/145 |
| 5,517,446 | 5/1996 | Ihara | 365/145 |

FOREIGN PATENT DOCUMENTS

| | | |
|---|---|---|
| 0364813 | 4/1990 | European Pat. Off. . |
| 2-110895 | 4/1990 | Japan . |

OTHER PUBLICATIONS

8172 IEEE International Solid–State Circuits Conference 37 (1994) Feb., pp. 268–269.
"FA 16.2: A 256kb Nonvolatile Ferroelectric Memory at 3V and 100ns," by T. Sumi, 1994 IEEE International Solid––State Circuits Conference, Feb. 18, 1994, pp. 268 and 269.

*Primary Examiner*—David C. Nelms
*Assistant Examiner*—Huan Hoang
*Attorney, Agent, or Firm*—Sughrue, Mion, Zinn, Macpeak and Seas

[57] ABSTRACT

The ferroelectric memory device includes (A) at least one memory cell array, the memory cell array including (a) a plurality of memory cells arranged in row and column directions, each of the memory cells having a capacitive element and a transistor, the capacitive element having a ferroelectric film interposed between electrodes facing to each other, storing and retaining binary data in accordance with polarization of the ferroelectric film, one of a source and a drain of the transistor being electrically connected to one of the electrodes of the capacitive element, and (b) a plate line being electrically connected to the other of the electrodes of the capacitive element; and (B) an arrangement for arranging a voltage of the plate line to be fixed and activating the transistor so as to arrange a voltage at a junction of the transistor and the capacitive element to be the same as the voltage of the plate line. The ferroelectric memory device in accordance with the invention accomplishes higher speed operation and lower consumption of electric power, prevents destruction of stored data, and simplifies voltage control and operation control of word lines.

16 Claims, 12 Drawing Sheets

16 PL VOLTAGE SUPPLYING CIRCUIT

FERROELECTRIC MEMORY DEVICE

BACKGROUND OF THE INVENTION

1. Field of the Invention

The invention relates to a ferroelectric memory device, and more particularly to a ferroelectric memory device including a plurality of memory cells each comprising a transistor to be used for switching and a capacitor for storing data therein.

2. Description of the Related Art

Before explanation is made about prior ferroelectric memory device, hereinbelow will be explained structure of operation principle of a memory cell to be used for a ferroelectric memory device with reference to FIGS. 1A and 1B which are circuit diagram and partial cross-sectional view, respectively.

A memory cell MC illustrated in FIG. 1A comprises a capacitive element C and a transistor T. The capacitive element C has a ferroelectric film FE interposed between electrodes facing to each other, and has two electrodes $C_1$ and $C_2$. One of the electrodes $C_1$ is electrically connected to a plate line PL. The transistor T includes a gate G electrically connected to a word line WL, and a source S and a drain D one of which is electrically connected to a bit line BL and the other to the electrode $C_2$ of the capacitive element C.

In general, a ferroelectric film causes spontaneous polarization, and has a hysteresis characteristic by which polarization caused when an external electric field is applied thereto makes a loop as shown in FIG. 2A. Due to the hysteresis characteristic, there occur bistable points indicated with "a" and "c" in FIG. 2A when the external electric field is ceased to be applied to the ferroelectric film FE. Accordingly, the capacitive element C using the ferroelectric film as an insulator can retain binary data, and also can hold the binary data even after a power supply is turned off. Namely, the ferroelectric film FE has a non-volatile characteristic.

In order to rewrite data stored at the point "a" with data stored at the point "c", a word line WL is first reduced into a high level to thereby turn on a transistor T. Then, a forward electric field having an intensity higher than that of a coercive electric field Ec is applied to the ferroelectric film FE of the capacitive element C by means of the bit line BL and the word line WL. To the contrary, in a case where data stored at the point "c" is to be rewritten with data stored at the point "a", a backward electric field having an intensity smaller than that of a coercive electric field -Ec is applied to the ferroelectric film FE.

For reading out data stored in the capacitive element C, the transistor T is turned on, and a forward electric field Emax is applied to the ferroelectric film FE by means of the bit line BL and the plate line PL. An electric charge corresponding to (Pmax+Pr) can be taken from the data stored at the point "a", while an electric charge corresponding to (Pmax−Pr) can be taken from the data stored at the point "c". Thus, it is possible to read out data stored in the capacitive element C by detecting a difference between the above mentioned electric charges. However, this read-out operation is destructive to the data stored at the point "a". Hence, after the data stored at the point "a" have been read out, a backward electric field -Emax is applied to the ferroelectric film FE to thereby rewrite the data to the point "a". Thus, the read-out operation is finished.

As illustrated in FIG. 2B, provided that the ferroelectric film FE has a thickness of dc and that a voltage applied across electrodes CP1 and CP2 is denoted by V, a relationship between the applied voltage V and an electric field E to be produced is represented by the equation: $V = E \times dc$. Hence, a relationship between a coercive electric field Ec and a coercive voltage Vc is represented by the equation: $Vc = Ec \times dc$. When a non-volatile memory including the memory cell MC in question is to be operated with a single power source, in general, a lower level in binary data is made to correspond to a point "d" (-Emax) and used as a lower power source voltage level, while a higher level is made to correspond to a point "b" (Emax) and used as a higher power source voltage level.

FIG. 3 illustrates a first example of a conventional ferroelectric memory device which is driven with a single power source and has a plurality of the above mentioned memory cells MC.

An illustrated ferroelectric memory device comprises a memory cell array 1x and a plate line voltage supplying circuit 16. The memory cell array 1x includes (a) a plurality of memory cells arranged in row and column directions, each of the memory cells having a capacitive element C and a transistor T, the capacitive element C comprising a ferroelectric film interposed between electrodes facing to each other, one of a source and a drain of the transistor T being electrically connected to one of the electrodes of the capacitive element C, (b) a plurality of word lines WL1 to WLn (only WL1 and WL2 are illustrated in FIG. 3) each associated with each row of the memory cells MC, each of the word lines WL1 and WL2 being electrically connected to gates of the transistors T included in memory cells MC disposed in a respective row, each of the word lines WL1 and WL2 reducing the memory cells MC into a selected condition at a selection level, (c) a plurality of first bit lines BL11 to BLn1 and second bit lines BL12 to BLn2 each associated with each column of the memory cells MC and each being electrically connected to the other of a source and a drain of the transistors T included in odd number ordered and even number ordered memory cells, respectively, disposed in a respective column, (d) a plurality of plate lines PL1 to PLn (only PL1 is illustrated in FIG. 3) each being disposed at every two rows of the memory cells MC and being electrically connected to the other of the electrodes of the capacitive elements C included in the memory cells MC in the two columns. The plate line voltage supplying circuit 16 is provided correspondingly to a certain number of word lines. For instance, in the illustrated ferroelectric memory device, the plate line voltage supplying circuit 16 corresponds to the word lines WL1 and WL2. The plate line voltage supplying circuit 16 includes a plurality of transistors, for instance, two transistors T41 and T42 in the illustrated ferroelectric memory device, each having a gate electrically connected to an associated word line, a source and a drain one of which is electrically connected to an associated plate line and to the other of which a voltage Vp1 for the plate line is to be applied. The plate line voltage supplying circuit 16 supplies the plate line voltage Vp1 to a plate line corresponding to a word line reduced on a selection level.

Hereinbelow will be explained a read-out operation of the ferroelectric memory device with reference to wave-forms illustrated in FIG. 4.

In a stand-by period, namely before a certain word line, for instance, WL1, rises up into a selection level, the first bit lines BL11 to BLn1, the second bit lines BL12 to BLn2 and the plate lines PL1 to PLn are in ground level. When the word line WL1 is reduced into a selected level, memory cells electrically connected to the word line WL1 are also reduced into a selected condition, and further the transistors are activated with the result that the plate line voltage Vp1 is supplied to the plate line PL1. As a result, data stored in the memory cells MC are read out onto the first bit lines BL11 to BLn1. The level of the second bit lines BL12 to BLn2, each of which form a pair with the first bit lines BL11 to BLn1, respectively, are scarcely changed, since the word line WL2 is in non-selected level, and hence the memory cells connected to the word line WL2 are also in non-selected level. By amplifying a voltage difference between the first bit lines BL11 to BLn1 and the second bit lines BL12 to BLn2, it is possible to read out data stored in memory cells reduced into a selected level.

For instance, Tatsumi Sumi et al., "FA16.2: A 256 Kb Nonvolatile Ferroelectric Memory at 3V and 100 ns", 1994 IEEE International Solid-State Circuits Conference, Digest of Technical Papers, pp 268–269, Feb. 18, 1994, reports that an access cycle time of 200 ns can be obtained at a source voltage of 3.0 V and a current consumption of 3 mA with a memory capacity of 256 Kb.

In a ferroelectric memory device, data are stored therein by imparting forward or backward induced polarization to a ferroelectric film of a capacitive element C of a memory cell MC. Thus, it is necessary in a ferroelectric memory device to supply a certain voltage to the plate lines PL1 to PLn as in the example illustrated in FIG. 3, since stored data are read out by detecting polarization state of the ferroelectric film of the capacitive element C. In addition, since the capacitive element C is made of ferroelectric substance, the capacitive element C usually has a greater capacity than that of DRAM.

A plate line PL is usually made of noble metal such as Au, Pt and Ru to obtain compatibility thereof with ferroelectric substance. However, it is difficult to thicken a thickness of those noble metals due to their processability, and in addition, it is not advantageous to increase a width of wirings from the viewpoint of densification of a memory capacity caused by thinner wirings. Accordingly, it is difficult to decrease resistance of wirings. As a result, it is not possible to avoid the time constant of the plate line PL1 from being increased, and hence it takes longer time to drive the plate line PL1. Thus, it is quite difficult to accomplish higher-speed operation. For instance, an ordinary DRAM can accomplish 90 ns of access cycle time by 64 Mb of a memory capacity. Furthermore, charge and discharge of the plate line PL1 cause greater consumption of electric power.

FIG. 5 illustrates a second example of a conventional ferroelectric memory device in which a voltage of the plate line is arranged to be fixed. Such a ferroelectric memory device has been suggested in Japanese Unexamined Patent Publication No. 2-110895, for instance.

An illustrated ferroelectric memory device comprises (a) a memory cell array 1y having the same structure as that of the memory cell array 1x illustrated in FIG. 3 except that a single plate line PL is used in place of a plurality of the plate lines PL1 to PLn (however, only two memory cells MC and a pair of the bit lines BL11 and BL12 are illustrated for clarity), (b) a plurality of sense amplifiers SA1 to SAn (only SA1 is illustrated) for amplifying a voltage difference between the pair of the bit lines BL11 and BL12 in accordance with control signals SEP and SEN at a predetermined timing, (c) a precharging circuit 17 for precharging the bit lines BL11 and BL12 to an intermediate voltage in accordance with a bit line precharging signal BLP, (d) an intermediate voltage generating circuit 2x for producing a voltage intermediate between logic "1" level and logic "0" level of a bit line and supplying the thus produced intermediate voltage both to the plate line PL and the precharging circuit 17, and (e) a reference level generating circuit 4x for reducing the bit lines BL11 to BL1n into a ground voltage level in accordance with bit line voltage establishing signal BLST just before a certain word line, for instance, WL1, is reduced into a selected level, and supplying a reference level to the bit line BL12 which forms a pair with the bit line BL11 to which data stored in the selected memory cell MC is read out by means of a dummy word line DWL1 which is reduced into a selected level synchronously with the word line WL1 being reduced into a selected level.

Hereinbelow is explained a read-out operation of the ferroelectric memory device illustrated in FIG. 5 with reference to FIG. 6 illustrating waveforms.

In a stand-by period, namely, before access to a memory cell MC starts, a pair of the bit lines BL11 and BL12 are precharged at an intermediate voltage Vm which is almost the same as that of the plate line PL.

After the access to a memory cell MC has started and just before the word line WL1 is reduced into a selected level, the bit line voltage establishing signal BLST is activated, while the bit lines BL11 and BL12, the word line WL1 and dummy word line DWL1 is reduced into a ground voltage level. A source voltage level may be used in place of the ground voltage level. Thereafter, both the word line WL1 and the dummy word line DWL1 are reduced into a selected level, and thus data stored in the selected memory cell MC are read out to the bit line BL11, and the reference level is supplied to the bit line BL12 from the reference level generating circuit 4x. Thereafter, in the same way as DRAM, a voltage difference between the bit lines BL11 and BL12 is amplified by the sense amplifier SA1, and the thus amplified voltage difference is detected as an output.

In general, there occurs a leak, though quite small, between a cell node Nmc, namely a junction point at which the transistor T is connected to the capacitive element C and a substrate which is in ground voltage level or source voltage level. Thus, if the transistor T of the memory cell MC is in off condition and thus the cell node Nmc is in floating condition in the stand-by period, the above mentioned leak causes the cell node Nmc to be in ground voltage level or source voltage level, resulting in that the spontaneous polarization of the memory cell MC is forced to be inverted. Thus, in the second example, the transistor T is turned on to a small degree with the word line WL1 to WLn being maintained at a voltage Vt (a threshold voltage of the transistor) intermediate between a selected level and a non-selected level, so that the bit line compensates for the leak of charges at the cell node Nmc into the substrate to maintain the cell node Nmc at an intermediate voltage which is almost the same as that of the plate line PL. Thus, the inversion of the spontaneous polarization is prevented.

In the second example, it is possible to make electric power consumption small. However, the transistor T of the memory cell MC often does not turn on due to dispersion in manufacturing, and thus the leak of the cell node Nmc cannot be compensated for, resulting in that it would take longer time until next access starts, which may cause the inversion of the spontaneous polarization to occur. Thus, the transistor T is turned on again so as to prevent the inversion of the spontaneous polarization.

In the first example, it is necessary to reduce the plate line PL into a predetermined voltage each time access is to be made. Thus, the first example has problems that it takes a long period of time for driving the plate line PL, it is difficult to accomplish a high speed operation, and electric power consumption increases due to charge and discharge of the plate line PL.

The second example dose not have the problems of the first example, since a predetermined voltage is regularly supplied to the plate line PL. In the second example, in order to prevent the spontaneous polarization of a ferroelectric film of the capacitive element C of the memory cell MC due to the leak from the cell node Nmc to a substrate, the transistor T is turned on to a small degree with the word line being maintained in the stand-by period at a certain level intermediate between a selected level and a non-selected level, thereby the leak of the cell node Nmc being compensated for by the bit line too maintain the cell node Nmc at a voltage which is almost the same as that of the plate line PL. In addition, the second example is structured so that the transistor T of the memory cell MC is turned on again to prevent a case where a transistor cannot be turned on due to manufacturing dispersion, and hence the leak of the cell node cannot be compensated for with the result that it would take a longer period of time until next access starts. Thus, in the second example, the word line control has to include four stages in voltage control and three stages in operation control, namely, a control of a selected/non-selected level for access, a control for turning the transistor T of the memory cell MC on to a small degree for compensation of a voltage at the cell node Nmc, and a control for turning again the transistor T on. Accordingly, the second example has a problem that the voltage control and the operation control of the word line are complicated.

Japanese Unexamined Patent Publication No. 2-110895 also discloses a semiconductor memory using ferroelectric substance. The disclosed semiconductor memory comprises a sense amplifier for detecting and amplifying a voltage change of a bit line pair caused by a memory cell. The memory cell has a ferroelectric capacitor comprising ferroelectric substance interposed between electrodes. A voltage at one of the electrodes of the ferroelectric capacitor is fixed at a voltage corresponding to a level intermediate between logic "1" and "0" levels of the bit line. Between the other electrode and the bit line is disposed a transistor to be used for transferring charges. Provided that a maximum gap between the electrodes of the ferroelectric capacitor is denoted by "d", and that an intensity of an electric field necessary for inversion of the spontaneous polarization of the ferroelectric substance is denoted by $Et[v/cm]$, a product $Et \times d$ is arranged to be smaller than almost a half of a voltage difference between voltages which correspond to logic "1" and "0" levels of the bit line, respectively.

SUMMARY OF THE INVENTION

It is an object of the present invention to provide a ferroelectric memory device capable of simplifying voltage control and operation control of a word line with high speed operation and low consumption of electric power being retained, and preventing the inversion of spontaneous polarization in a stand-by period.

The ferroelectric memory device in accordance with the invention includes: (A) at least one memory cell array, the memory cell array having (a) a plurality of memory cells arranged in row and column direction, each of the memory cells having a capacitive element and a transistor, the capacitive element including a ferroelectric film interposed between electrodes facing to each other, storing and retaining binary data in accordance with polarization of the ferroelectric film, one of a source and a drain of the transistor being electrically connected to one of the electrodes of the capacitive element, (b) a plurality of word lines each associated with each row of the memory cells, each of the word lines being electrically connected to gates of transistors included in memory cells disposed in a respective row, each of the word lines reducing the memory cells into a selected condition at a selection level, (c) a plurality of bit lines each associated with each column of the memory cells and being electrically connected to the other of a source and a drain of the transistors included in memory cells disposed in a respective column, (d) a plate line being electrically connected to the other of the electrodes of the capacitive elements included in the memory cells; (B) a plate line voltage supplying device for supplying the plate line with an intermediate voltage which corresponds to a level intermediate between high and low levels among logic levels of the binary data; (C) a precharging device for precharging the bit lines to a voltage which corresponds to one of the high and low levels among logic levels of the binary data before certain word lines are reduced into a selection level in response to an external address signal; (D) a plurality of sense amplifiers for comparing a signal read out of a selected memory cell to a bit line precharged by the precharging device with a reference level, and amplifying a difference between the signal and the reference level; (E) a bit line voltage retaining device for retaining the bit lines to be the intermediate voltage after amplification by the sense amplifiers has been completed; and (F) an electrode voltage compensating device for reducing a voltage at a junction of the transistor and the capacitive element to be the intermediate voltage by reducing a certain word line into a selected level and activating a transistor of a memory cell connected to the certain word line while the bit lines are being retained to be the intermediate voltage by the bit line voltage retaining device. For instance, the intermediate voltage is selected to be a half of a source voltage. In a preferred embodiment, the voltage of the plate line is arranged to be fixed.

In a preferred embodiment, each of the bit lines includes a pair of first and second bit lines, each of the memory cells includes first and second memory cells in each of which the other of a source and a drain of the transistor is electrically connected to the first and second bit lines, respectively, each of the word lines includes first and second word lines for reducing the first and second memory cells into a selected condition, and the ferroelectric memory device further including a reference level generating circuit for transmitting a reference level to one of the first and second bit lines forming a pair with the other to which a signal read out of a selected memory cell is transmitted. Herein, a voltage difference between the first and second bit lines is amplified by the sense amplifier.

The bit line voltage retaining device preferably includes (a) a balance circuit for balancing the first and second bit lines to be at the same voltage, and (b) an intermediate voltage supplying circuit for supplying the intermediate voltage to the first and second bit lines. The electrode voltage compensating device preferably includes a word line selecting device for reducing the first and second word lines into a selected level in a certain period during the intermediate voltage supplying circuit supplies the intermediate voltage to the first and second bit lines. The intermediate voltage supplying circuit preferably includes at least one transistor.

The word line selecting device preferably includes an address counter for transmitting an internal address signal, and an address switching circuit for selecting one of the external and internal address signals, the address switching circuit being adapted to select the internal address signal when an electrode voltage of the capacitive element is to be compensated for.

In a preferred embodiment, the electrode voltage compensating device includes a circuit which retains the bit lines at the intermediate voltage by the bit line voltage retaining device and activates transistors of all of the memory cells in a period except a precharge period in which the bit lines are precharged by the precharging device and a subsequent period in which a certain word line is on a selected level by the external address signal. For instance, the electrode voltage compensating device preferably reduces the first and second word lines into a selected level in turn by a certain number of word lines.

The electrode voltage compensating device preferably includes a word line level control circuit for applying a certain voltage to all of the word lines, the certain voltage being higher than a sum of the intermediate voltage and a threshold voltage of the transistor.

The present invention further provides a ferroelectric memory device including: (A) at least one memory cell array, the memory cell array including (a) a plurality of memory cells arranged in row and column directions, each of the memory cells having a capacitive element and a transistor, the capacitive element including a ferroelectric film interposed between electrodes facing to each other, storing and retaining binary data in accordance with polarization of the ferroelectric film, one of a source and a drain of the transistor being electrically connected to one of the electrodes of the capacitive element, and (b) a plate line being electrically connected to the other of the electrodes of the capacitive element; and (B) an arrangement for arranging a voltage of the plate line to be fixed and activating the transistor so as to arrange a voltage at a junction of the transistor and the capacitive element to be the same as the voltage of the plate line. The voltage of the plate line is preferably equal to a voltage which corresponds to a level intermediate between high and low levels among logic levels of the binary data. The voltage of the plate line is preferably equal to a half of a source voltage.

In accordance with the invention, a voltage of the plate line is arranged to be fixed and the transistor is activated so as to arrange a voltage at a junction of the transistor and the capacitive element to be the same as the voltage of the plate line. Thus, the ferroelectric memory device makes it possible to accomplish higher speed operation and lower consumption of electric power, prevent destruction of stored data, and simplify voltage control and operation control of word lines.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 7:
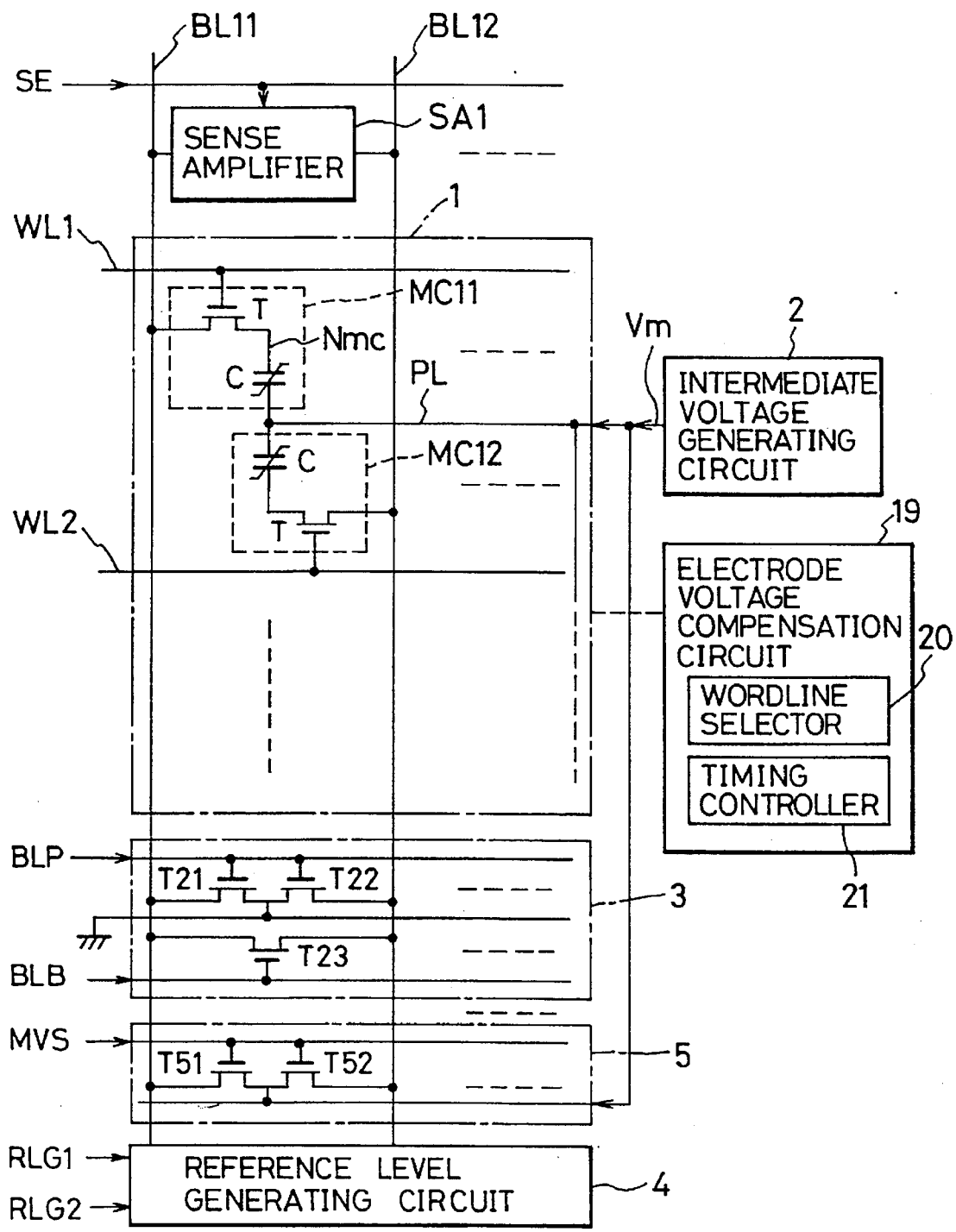
FIG. 7 is a circuit diagram of a ferroelectric memory device in accordance with the first embodiment of the present invention.

A ferroelectric memory device in accordance with the first embodiment comprises a memory cell array 1, an intermediate voltage generating circuit 2, a precharging and balancing circuit 3, a reference level generating circuit 4, a plurality of sense amplifiers SA (only SA1 is illustrated in FIG. 7), an intermediate voltage supplying circuit 5, and a circuit 19 for compensating for voltage of electrodes of a capacitive element C.

The memory cell array 1 includes a plurality of memory cells MC having the same structure and arranged in the same manner as the memory cells MC illustrated in FIGS. 1A, 1B, 3 and 5. Namely, the memory cells MC are arranged in row and column directions. Each of the memory cells MC has a capacitive element C and a transistor T. The capacitive element C comprises a ferroelectric film interposed between electrodes facing to each other, and stores and retains binary data in accordance with polarization of the ferroelectric film. One of a source and a drain of the transistor T is electrically connected to one of the electrodes of the capacitive element C. Hereinbelow, among those memory cells MC, an odd-number ordered memory cell is referred to as a first memory cell (only MC11 is illustrated in FIG. 7) and an even-number ordered memory cell is referred to as a second memory cell (only MC12 is illustrated).

A plurality of word lines WL are associated with each row of the memory cells MC11 and MC12. Each of the word lines WL is electrically connected to gates of transistors T included in memory cells MC disposed in a respective row so that each of the word lines WL reduces the memory cells into a selected condition at a selection level. Hereinbelow, among those word lines WL, an odd-number ordered word line is referred to as a first word line (only WL1 is illustrated in FIG. 7) and an even-number ordered word line is referred to as a second word line (only WL2 is illustrated).

A plurality of bit lines are associated with each column of the memory cells MC11 and MC12. Each of the bit lines is electrically connected to the other of a source and a drain of the transistors included in memory cells disposed in a respective column. Hereinafter, among the bit lines BL, a bit line which is connected to a source or a drain of the transistors of the odd-number ordered memory cells is referred to as a first bit line (only BL11 is illustrated), while a bit line which is connected to a source or a drain of the transistors of the even-number ordered memory cells is referred to as a second bit line (only BL12 is illustrated). The first and second bit lines form a pair.

The memory cell array 1 also includes a plate line PL electrically connected to the other of electrodes of all of the capacitive elements C.

The intermediate voltage generating circuit 2 generates an intermediate voltage Vm which corresponds to a level intermediate between high and low levels among logic levels of the binary data, and regularly supplies the intermediate voltage Vm to the plate line PL. For instance, the intermediate voltage Vm is arranged to be a half of a source voltage.

The precharging and balancing circuit 3 comprises transistors T21, T22 and T23. The precharging and balancing circuit 3 precharges the first and second bit lines BL11 and BL12 in response to active level of a precharge signal BLP to a voltage which corresponds to one of the high and low levels among logic levels of the binary data, and balances the first and second bit lines BL11 and BL12 to be the same voltage in response to active level of a bit line balancing signal BLB. In the first embodiment, the first and second bit lines BL11 and BL12 are precharged to a ground voltage corresponding to the low level of the binary data.

To one of the first and second bit lines (for instance, BL11) is transmitted a signal read out of a selected memory cell MC in response to a selected level of reference level generating control signals RLG1 and RLG2. The reference level generating circuit 4 supplies the other of the first and second bit lines (for instance, BL12), which forms a pair with the above mentioned bit line, with a reference level which is an intermediate level between high and low levels of read-out levels of the binary data.

The sense amplifier SA1 amplifies a voltage difference between the first and second bit lines BL11 and BL12 in response to active level of a sense amplifying active signal SE.

The intermediate voltage supplying circuit 5 comprises T51 and T52, and supplies the first and second bit lines BL11 and BL12 with the intermediate voltage Vm provided from the intermediate voltage generating circuit 2 in response to active level of an intermediate voltage supplying signal MVS.

The circuit 19 for compensating for voltage of electrodes of the capacitive element C includes a word line selector 20 and a timing controller 21. The word line selector 20 regularly reduces the first and second word lines WL1 and WL2 into a selected level in turn by a certain number of word lines, and activates the transistors of a memory cell connected to the selected word line to thereby reduce a voltage at a cell node Nmc, namely a junction of the transistor T and the capacitive element C, to be the intermediate voltage Vm in a certain period during the intermediate voltage Vm is being supplied to the first and second bit lines BL11 and BL12 by the intermediate voltage supplying circuit 5.

Figure 8:
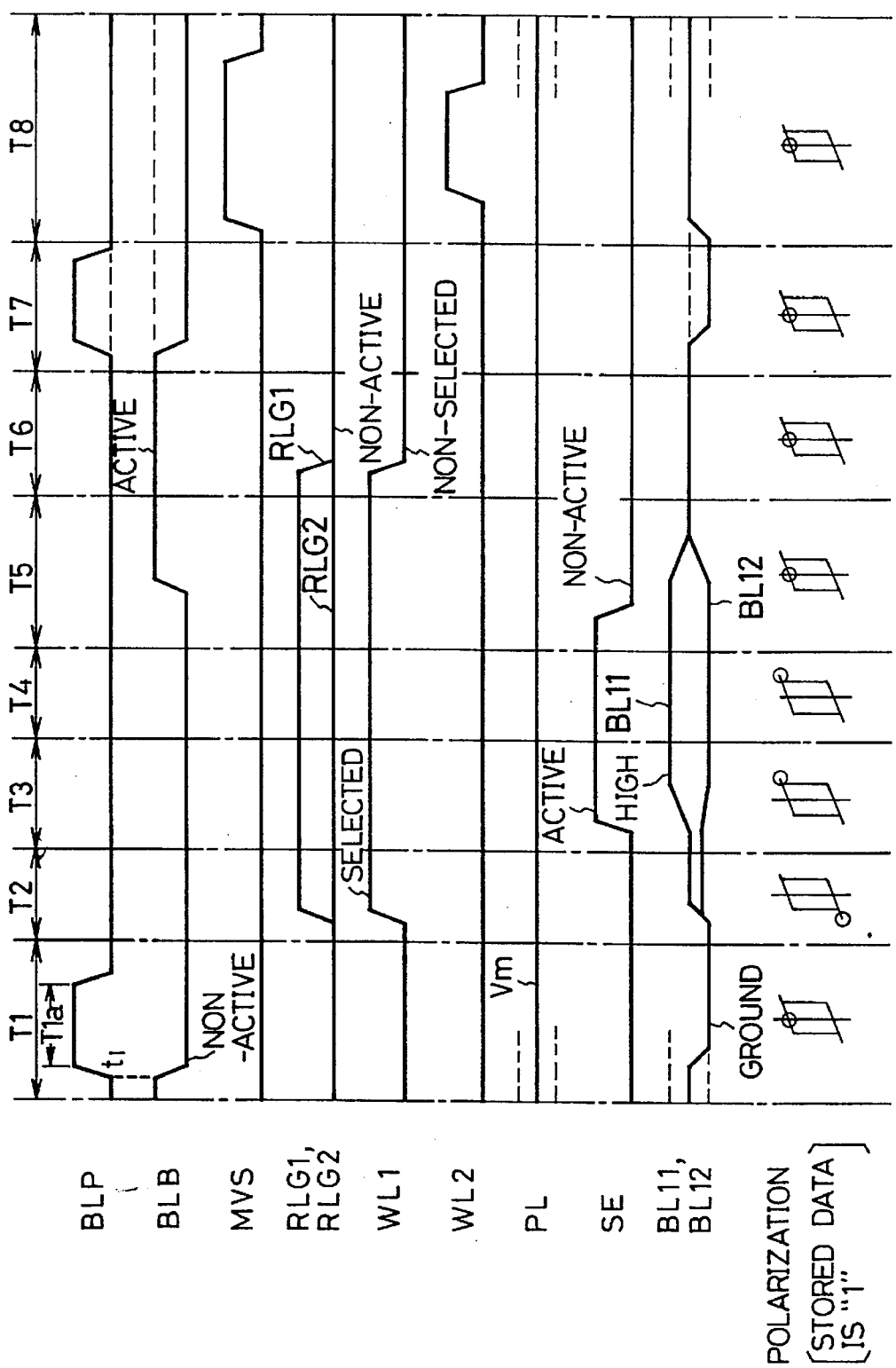
FIG. 8 is a timing chart of signals transmitting in the ferroelectric memory device illustrated in FIG. 7.

Hereinbelow will be explained the operation of the ferroelectric memory device in accordance with the first embodiment with reference to the timing chart of signals illustrated in FIG. 8.

In a period T1 which is just prior to a period T2 in which the word line WL1 among the plurality of word lines is reduced into a selected level in response to an external address signal, the precharge signal BLP is made to be in an active level or a high level during a predetermined period T1a to thereby precharge the bit lines BL11 and BL12 to a ground level. In addition, at the timing $t_1$ at which the precharge signal BLP rises up, the balance signal BLB is supplied to the bit lines to thereby reduce the bit lines into a non-active level or a low level. Namely, the period T1 is a period for precharging the bit line.

Figure 1A:
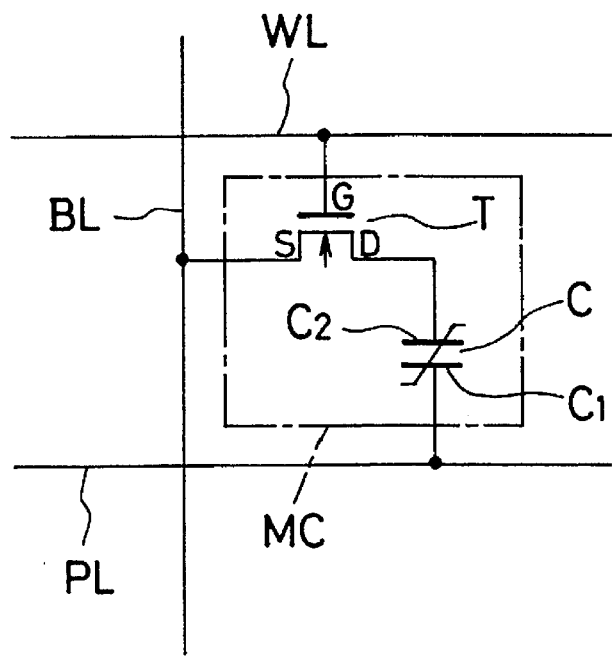
FIG. 1A is a circuit diagram of a memory cell and surroundings to be used for a ferroelectric memory device.
Figure 1B:
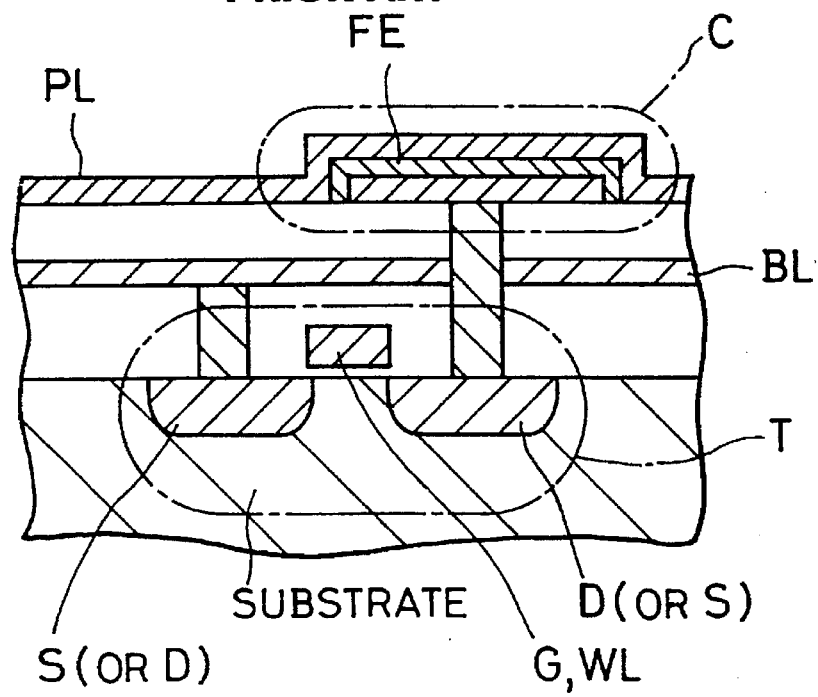
FIG. 1B is a cross-sectional view illustrating a memory cell and surroundings to be used for a ferroelectric memory device.
Figure 2A:
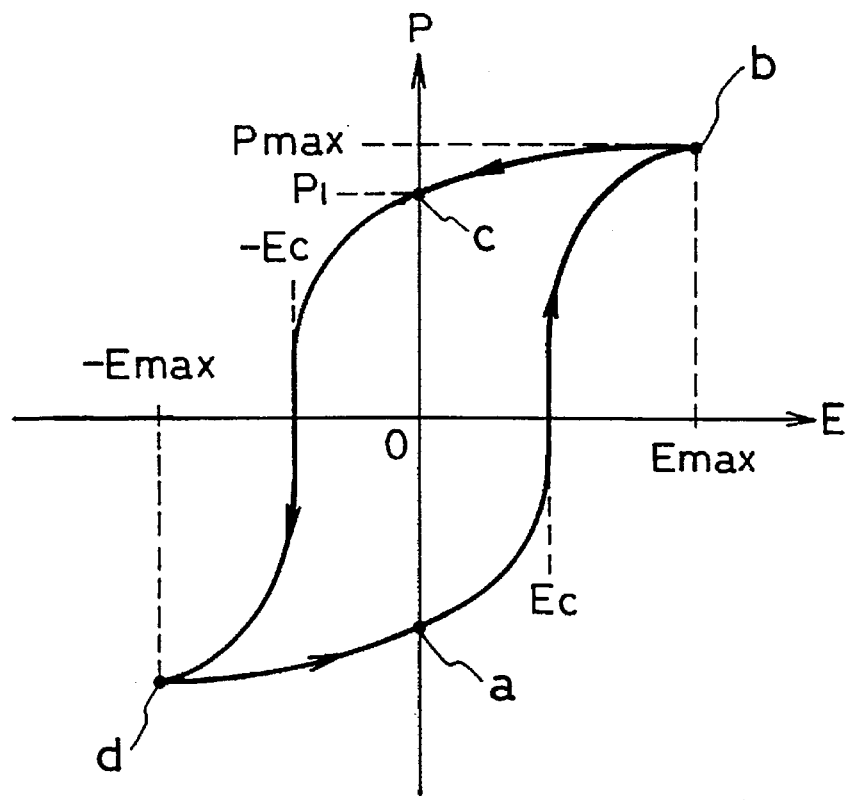
FIG. 2A illustrates a hysteresis loop showing a relationship between an electric field applied to the memory cell illustrated in FIGS. 1A and 1B and polarization.
Figure 2B:
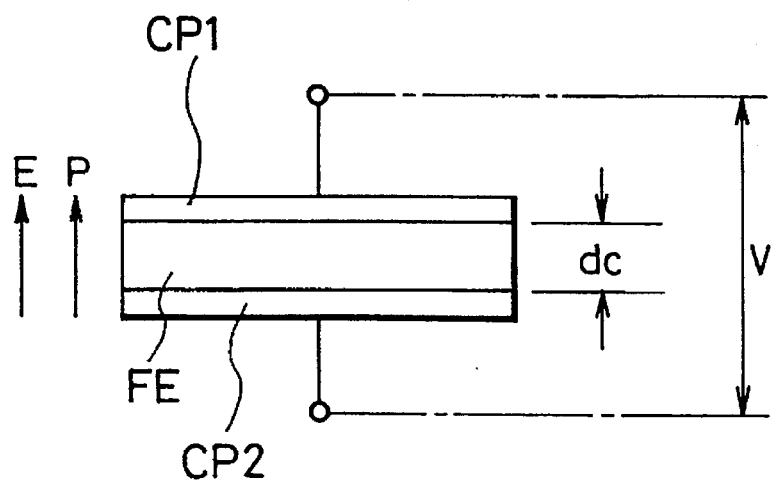
FIG. 2B is a schematic view for explaining a relationship between an applied voltage and an electric field produced by the voltage.
Figure 3:
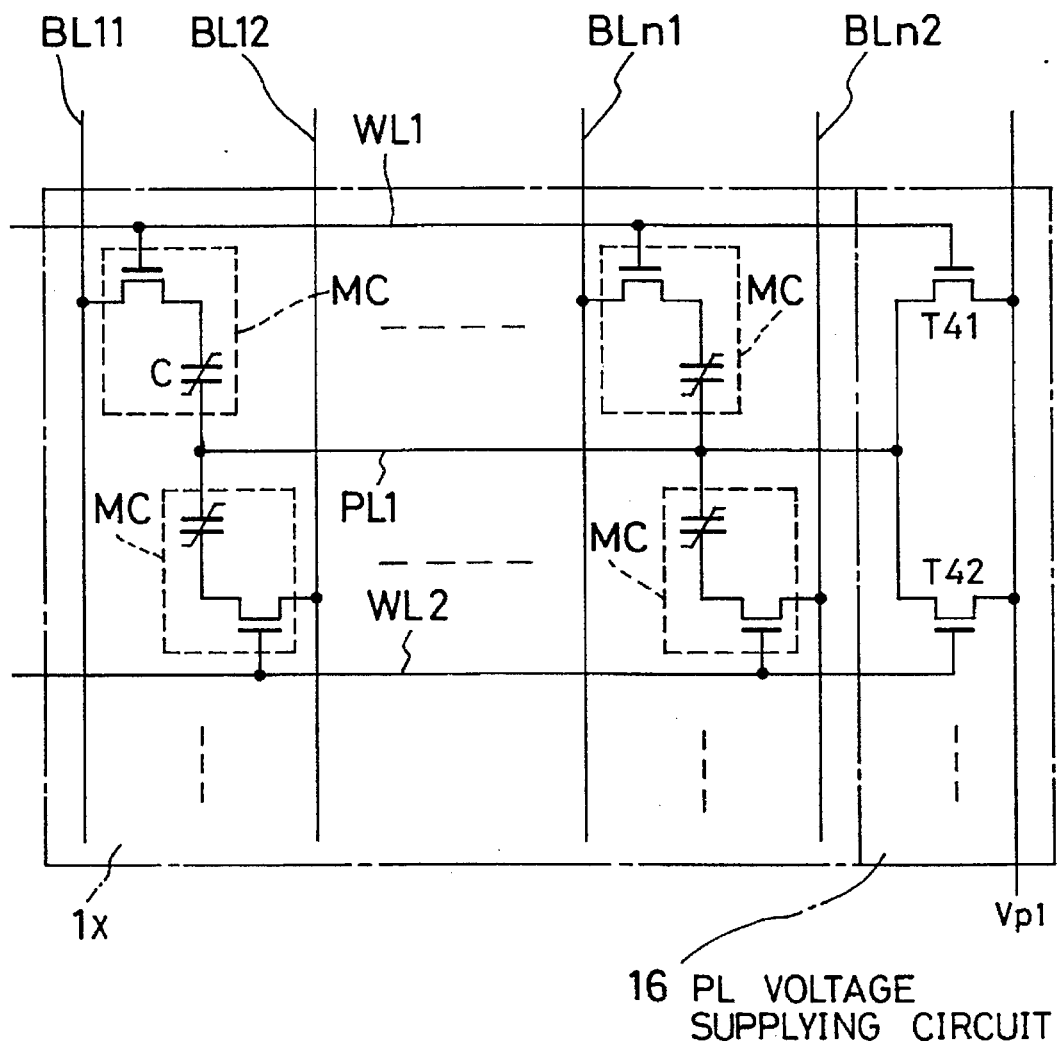
FIG. 3 illustrates a circuit diagram of the first example of a conventional non-volatile ferroelectric memory device.
Figure 4:
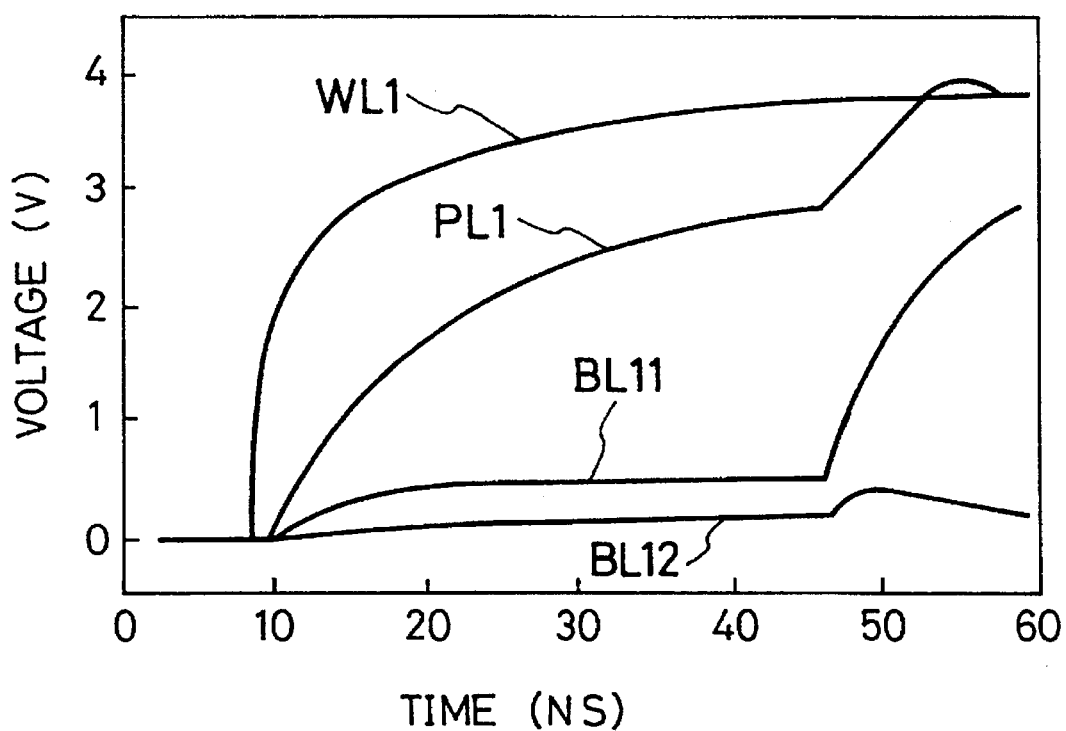
FIG. 4 illustrates waveforms of signals transmitting in the ferroelectric memory device illustrated in FIG. 3.
Figure 5:
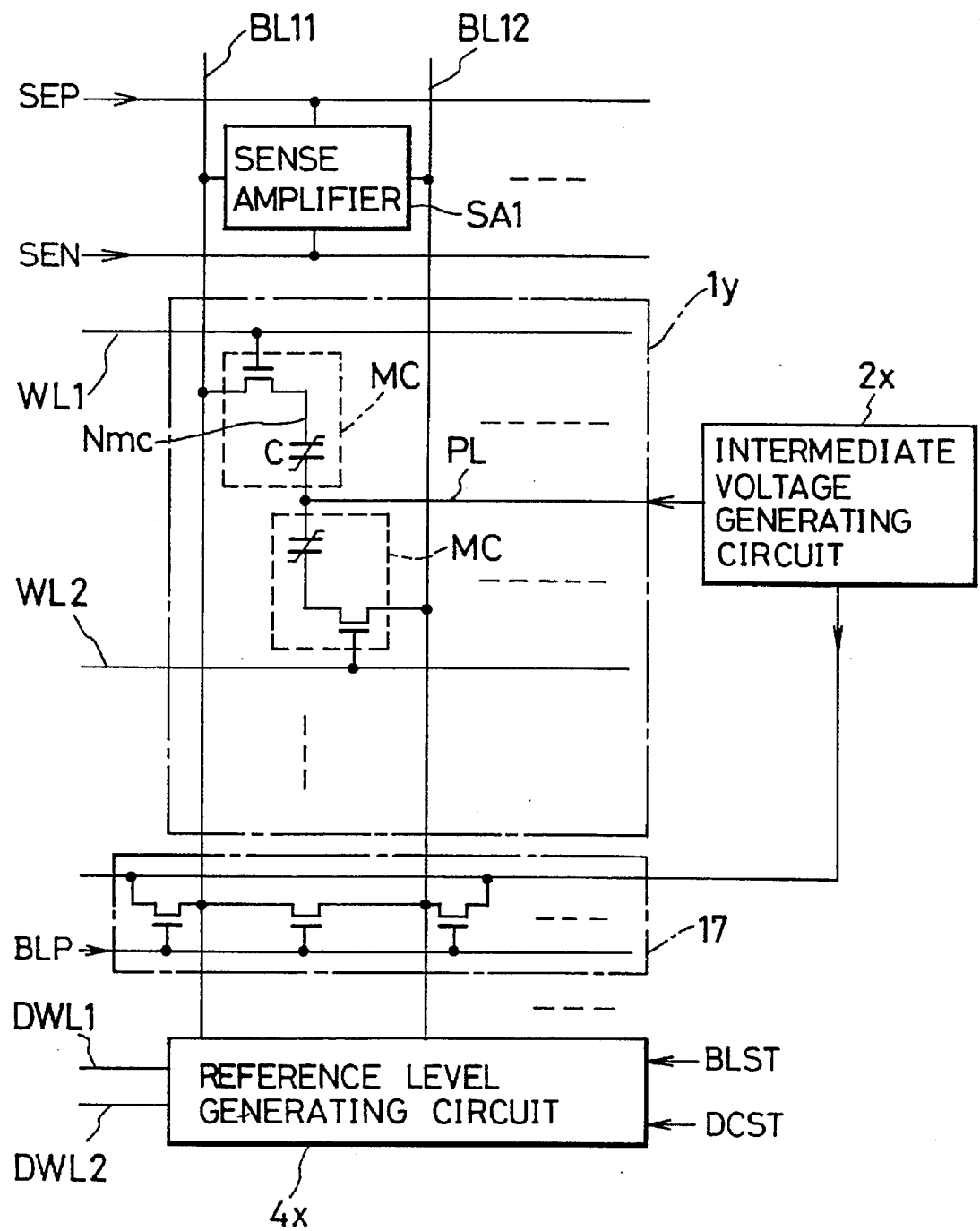
FIG. 5 illustrates a circuit diagram of the second example of a conventional non-volatile ferroelectric memory device.
Figure 6:
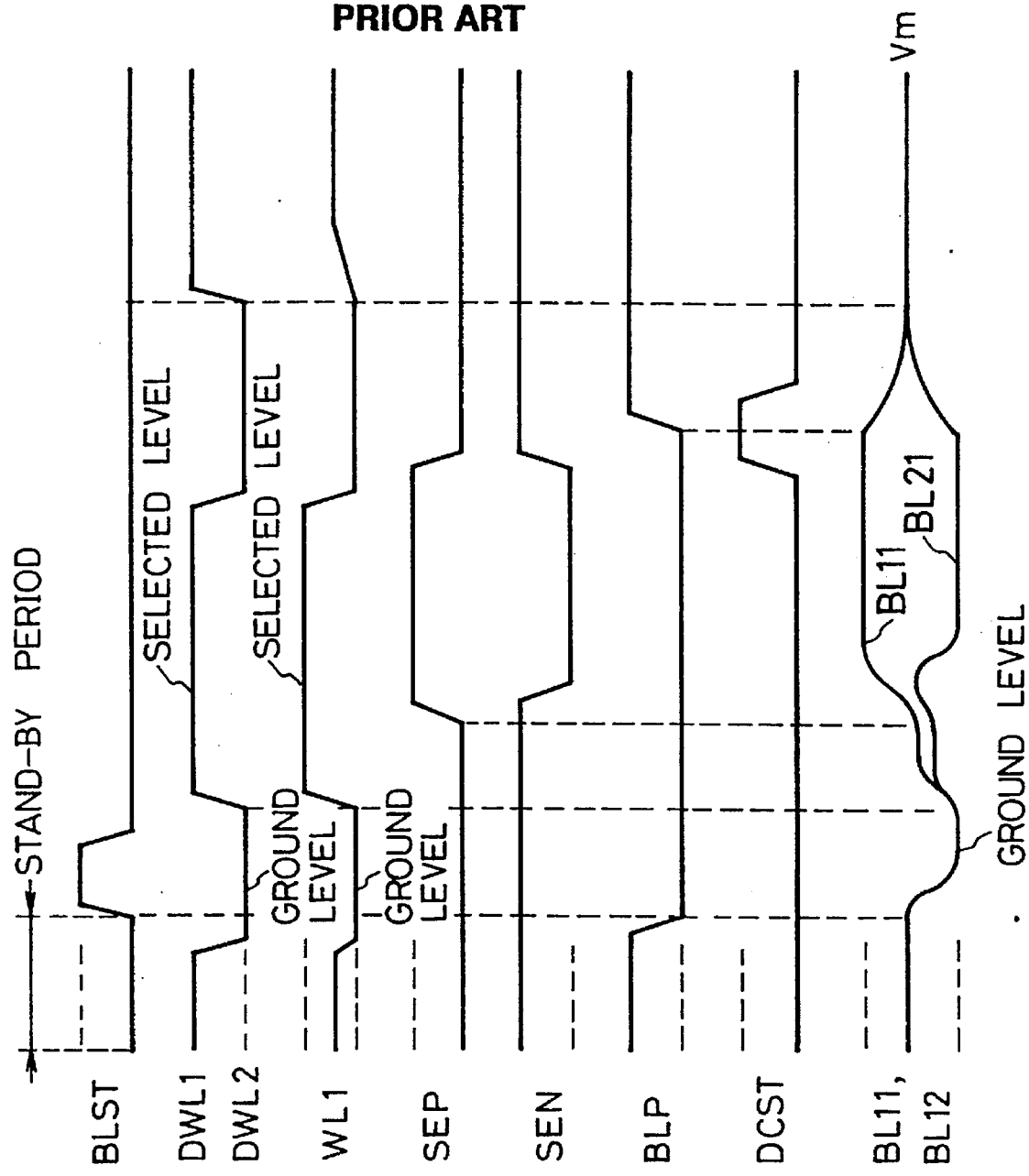
FIG. 6 is a timing chart of signals transmitting in the ferroelectric memory device illustrated in FIG. 5.

In the subsequent period T2, the word line designated by the external address signal, for instance WL1, is reduced into a selected level, and the corresponding reference level generating control signal RLG1 is made to be in an active level, so that the memory cell MC11 connected to the selected word line WL1 is reduced into a selected condition, thereby data stored in the memory cell MC11 is read out to the corresponding bit line BL11. Concurrently, the reference level generating circuit 4 supplies the bit line BL12 with the reference level. Namely, the period T2 is a period for reading out the stored data. Thus, since the bit line BL11 is maintained at a ground level of the precharge level and the plate line PL is maintained at the intermediate voltage Vm, to the cell node Nmc is applied a voltage −Vm measured on the basis of a voltage of the plate line PL, and thus the ferroelectric substance of the capacitive element C is driven to a point "d" in FIG. 2A. Accordingly, different levels of a signal are read out to the bit line BL11 in dependence on the polarization of the capacitive element C prior to the reading-out, namely, in dependence on whether the polarization is represented with the point "a" or "c" in FIG. 2A. The polarization at the point "c" in FIG. 2A is changed to the point "d", which means that the stored data was destroyed.

In the subsequent period T3, a sense amplification activating signal SE is reduced into an active level to activate the sense amplifiers SA1, thereby a voltage difference between the bit lines BL11 and BL12 is amplified. If the data stored in the selected memory cell MC11 is on "1" level, the bit line BL11 is in a high level among source voltage levels (FIG. 8 shows this case), while if the data stored in the selected memory cell MC11 is on "0" level, the bit line BL11 is in a ground level. Since the plate line PL is fixed at the intermediate voltage Vm, the ferroelectric substance in the capacitive element C is driven to the point "b" when the stored data represents "1", while to the point "d" when "0". Thus, the period T3 is a period for sense amplification.

In a period T4 in which the voltage of the bit lines BL11 and BL12 is in stable condition, the data read out of the memory cell MC11 is outputted, and it is possible to control a voltage of the bit lines BL11 and BL12 by externally coming data and write the data into the memory cell MC11. Thus, the period T4 is a period for reading and/or writing.

In a subsequent period T5, the sense amplification activating signal SE is reduced into a non-active level to thereby reduce the sense amplifier SA1 into a non-active condition. Subsequently, the bit line balance signal BLB is activated to thereby balance the bit lines BL11 and BL12 so that they are at the same voltage. Since such balancing causes the bit lines BL11 and BL12, which is in a source level and a ground level, respectively, to be at the same level, namely, a level intermediate between the source and ground levels, specifically equal to a half of the source level, there exists no voltage applied across the electrodes of the capacitive element C. Thus, the polarization returns to one observed prior to the reading-out operation, and now exists in accordance with the written data. Namely, the period T5 is a period for storage operation.

In a subsequent period T6, the word line WL1 having been reduced in a selected level and the corresponding reference level generation control signal RLG1 having been reduced in an active level are turned to a non-selected level and a non-active level, respectively, to thereby turn the memory cell MC11 into a non-selected condition. Concurrently, the bit lines BL11 and BL12 are disconnected from the reference level generating circuit 4 for retaining the data stored in the memory cell MC11. Namely the period T6 is a period for retaining the stored data.

Thus, a series of operations including reading out stored data, rewriting, writing externally coming data, and data retaining are completed.

In a memory cell which does not accomplish reading out stored data and writing externally coming data, or in a period in which such reading and writing are not carried out, there is carried out an operation for compensating for a voltage across the electrodes of the capacitive element in a period T8. It should be noted that a period T7 illustrated in FIG. 8 may be omitted.

In the period T8, the intermediate voltage Vm is first supplied to the bit lines BL11 and BL12. During the intermediate voltage Vm is being supplied to the bit lines BL11 and BL12, the word line WL2 is reduced into a selected level, and the transistors T of memory cells MC connected to the word line WL2 are activated. This operation causes the voltage change at the cell node Nmc of the memory cell MC to be small and thus maintains the voltage at the cell node Nmc to be almost the same as the voltage of the plate line PL. Hence, it is possible to prevent destruction (in other words, the inversion or malfunction of the spontaneous polarization of the capacitive element C) of data stored in the memory cell MC.

For regularly reducing a certain word line (for instance, the word line WL2) into a selected level in the period T8, an external address signal may be input into the word line, or an internal address signal may be produced.

Figure 9:
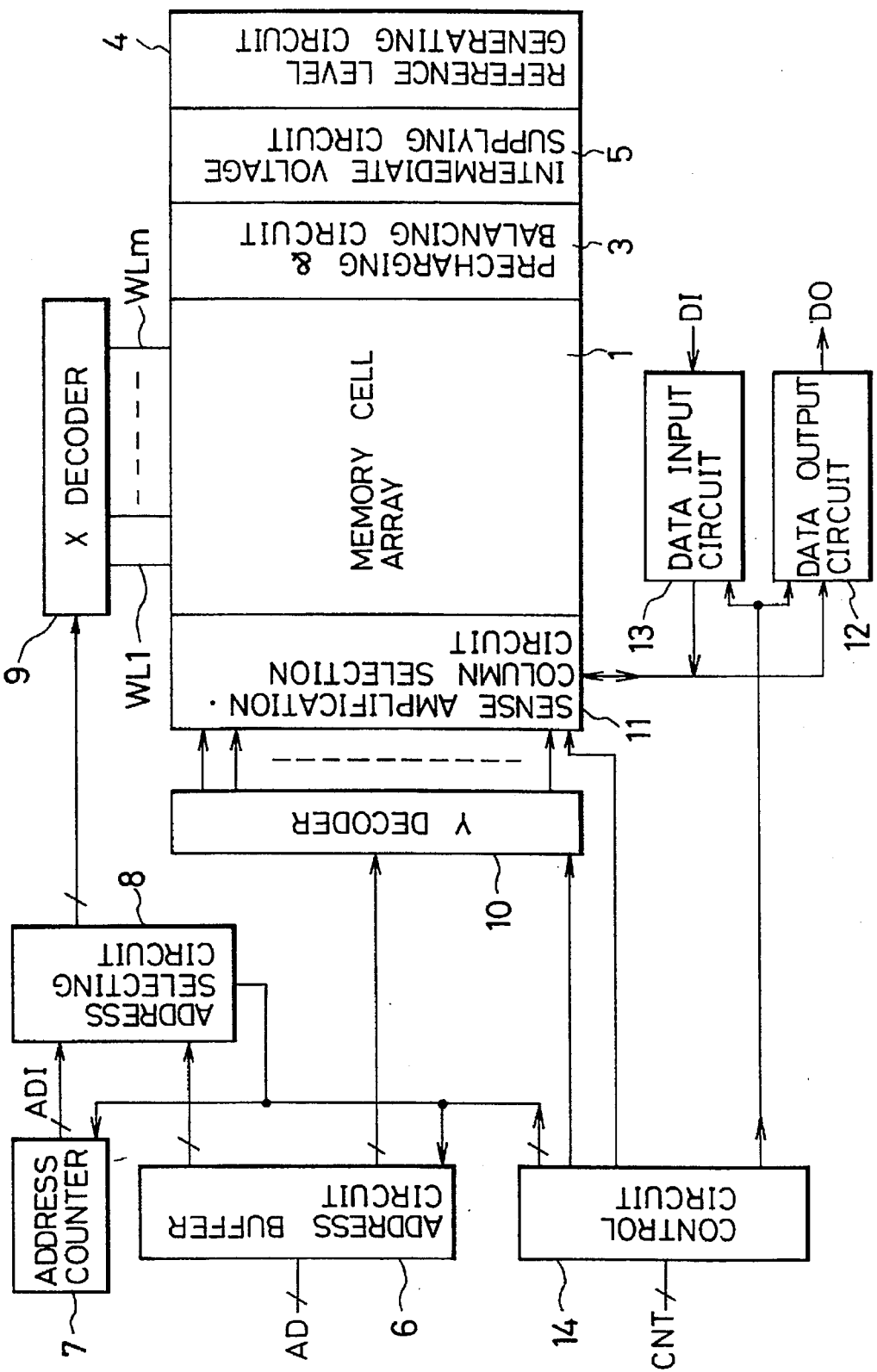
FIG. 9 is a block diagram of a ferroelectric memory device in accordance with the second embodiment of the present invention.

FIG. 9 illustrates a block diagram of the second embodiment in which a method of producing an internal address signal is used.

A ferroelectric memory device in accordance with the second embodiment includes the same memory cell array 1, precharging and balancing circuit 3, reference level generating circuit 4 and intermediate voltage supplying circuit 5 as those used in the first embodiment, but does not include the intermediate voltage generating circuit 2 unlike the first embodiment. The sense amplifier SA is included in a sense amplification and column selection circuit 11. The ferroelectric memory device in accordance with the second embodiment also includes an X decoder 9, a Y decoder 10, a data output circuit 12 and a data output circuit 13, which are basically the same as those of DRAM. Hence, explanation about them is omitted. Similarly, a part corresponding to a column selection circuit within the sense amplification and column selection circuit 11 will not be explained.

An address buffer circuit 6 receives an external address signal AD and emits address signals to an address selecting circuit 8 and the Y decoder 10 under the control by a control circuit 14. An address counter 7 emits an internal address signal ADI to the address selecting circuit 8 under the control by the control circuit 14. The address selecting circuit 8 selects one of the address signal emitted from the address buffer circuit 6 and the internal address signal ADI under the control by the control circuit 14, and transmits the selected one to the X decoder 9. The X decoder 9 reduces a certain word line among a plurality of the word lines WL1 to WLm into a selected level in accordance with the received signal.

Access caused by the external address signal AD is the same as that in DRAM. In the period T8 in which the compensation for a voltage of the electrodes of the capacitive element is to be carried out, a certain word line is reduced into a selected level in accordance with the internal address signal ADI emitted from the address counter 7.

Figure 10:
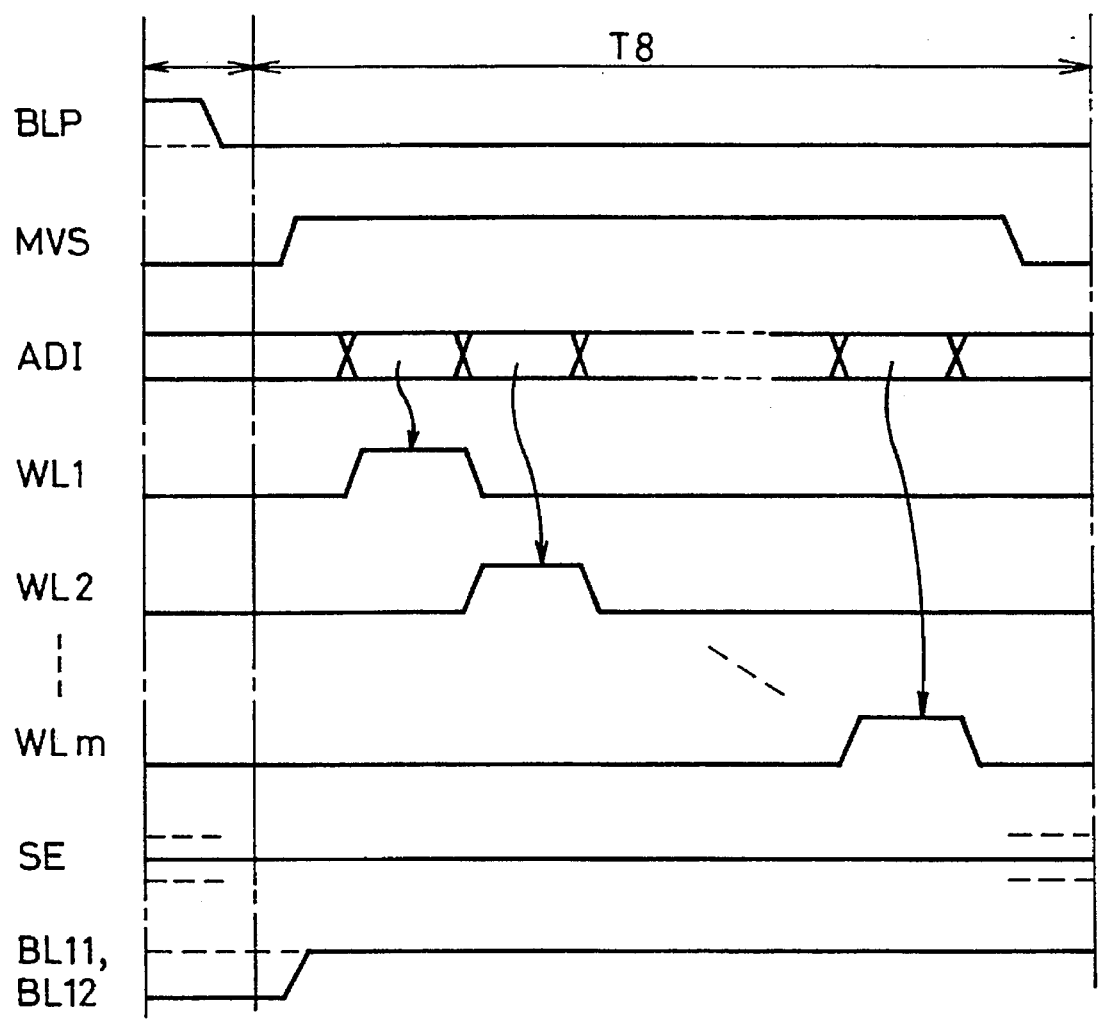
FIG. 10 is a timing chart of signals transmitting in the ferroelectric memory device illustrated in FIG. 9.

FIG. 10 is a timing chart showing that the word lines WL1 to WLm are reduced in turn into a selected level in accordance with the internal address signal ADI. Though FIG. 10 illustrates an example in which the word lines WL1 to WLm are reduced in turn into a selected level one by one, a plurality of word lines among the word lines WL1 to WLm may be concurrently reduced into a selected level.

In the first and second embodiments, since a voltage at the plate line PL is fixed, there occurs no charge and discharge at the plate line. Thus, it is possible to accomplish higher speed operation and lower consumption of electric power accordingly. In addition, both the control of the selected/non-selected level for compensation for a voltage at the cell node and the voltage and operation control consist of two stages, and hence it is possible to remarkably simplify those controls in comparison with the second example in prior art statement which includes four stages for voltage control and three stages for operation control. In addition, it is also possible to prevent destruction of data stored in a memory cell.

Figure 11:
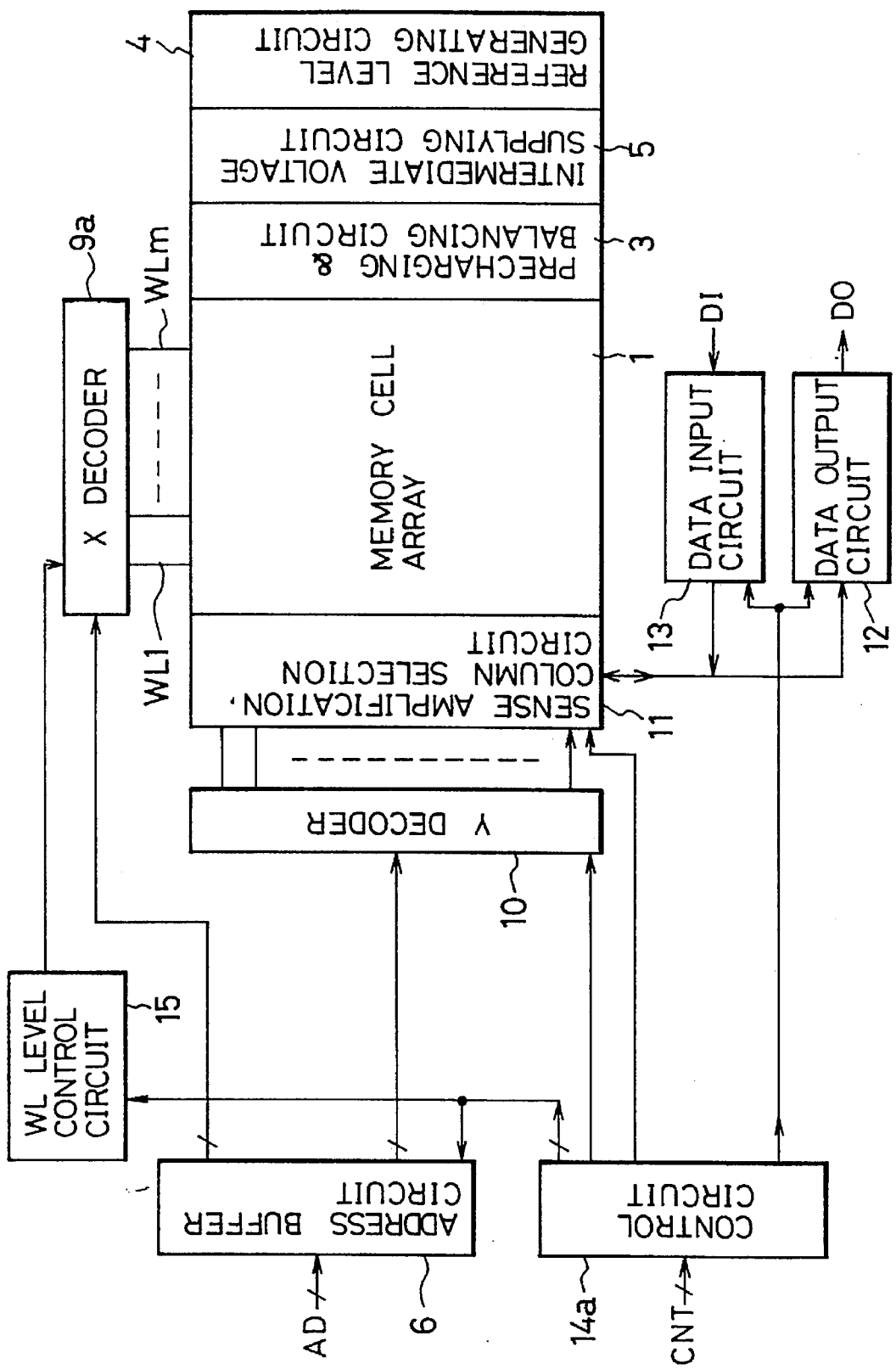
FIG. 11 is a block diagram of a ferroelectric memory device in accordance with the third embodiment of the present invention.
Figure 12:
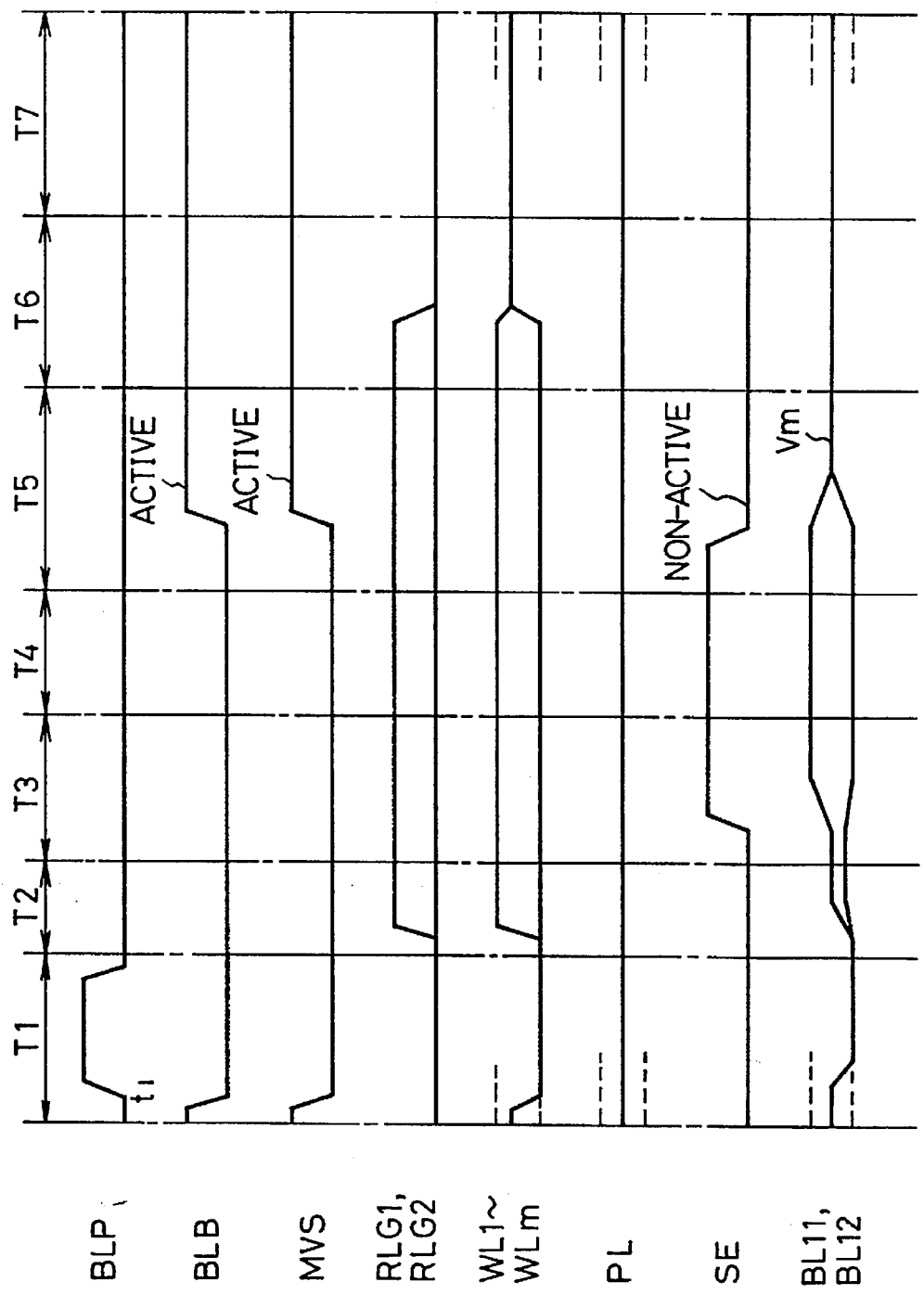
FIG. 12 is a timing chart of signals transmitting in the ferroelectric memory device illustrated in FIG. 11.

FIG. 11 is a block diagram illustrating a ferroelectric memory device in accordance with the third embodiment, and FIG. 12 is a timing chart of signals for explaining the operation of the ferroelectric memory device.

The third embodiment is different from the second embodiment illustrated in FIGS. 9 and 10 only in that the circuit 19 for compensating for voltage of electrodes of the capacitive element C comprises a word line level control circuit 15, an X decoder 9a and a control circuit 14a in place of the combination of the address counter 7, the address selecting circuit 8, the X decoder 9 and the control circuit 14, and that the circuit 19 is constructed as a circuit for retaining the bit lines BL11 and BL12 at the intermediate voltage Vm by the intermediate voltage supplying circuit 5 and causing all the word lines WL1 to WLm to be at a certain voltage which is higher than a sum of the intermediate voltage Vm and a threshold voltage Vt of the transistor T of the memory cell MC to thereby activate all the transistors T of the memory cells MC included in the memory cell array 1 in a period except a precharge period in which the bit lines BL11 and BL12 are precharged by the precharging and balancing circuit 3 and a subsequent period in which a certain word line is reduced into a selected level the said external address signal AD.

In the third embodiment, after the operation of reading from and writing to the memory cell has been completed, the sense amplification activating signal SE is reduced into a non-active level in a period T5. Then, both the bit line balance signal BLB and the intermediate voltage supplying signal MVS are reduced into an active level to thereby maintain the bit lines BL11 and BL12 at the intermediate voltage Vm. Thus, all the word lines WL1 to WLm including the word lines being in a selected level are reduced into a level so that the transistors T of all the memory cells MC are activated. Thereafter, this condition is maintained until the precharging signal BLP rises up at the timing t1 in a period T1 at which a subsequent access is to start. As a result, to the cell node Nmc is supplied the intermediate voltage Vm, which is equal to the voltage at the plate line PL, in a period except a period for access to a memory cell including a bit line precharging period, thereby it is possible to prevent destruction of data stored in the memory cells.

The third embodiment accomplishes higher speed operation and lower consumption of electric power, and prevents data destruction similarly to the first and second embodiments. The control for a voltage of the word line includes two stages if a voltage measured when the transistors T of all the memory cells are activated is in a selected level of ordinary access, or three stages if a voltage measured when the transistors T of all the memory cells are activated is a level different from a selected level of ordinary access. Though the word line voltage control may be more complex than the first and second embodiments, the operation for selecting word lines in a period for compensating for a voltage at the cell node Nmc is no longer necessary, and hence the word line control is simplified in comparison with the first and second embodiments. In addition, it is possible to increase the operation speed to a degree that the operation for selecting word lines is unnecessary.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A ferroelectric memory device comprising:
   (A) at least one memory cell array, said memory cell array including (a) a plurality of memory cells arranged in row and column directions, each of said memory cells having a capacitive element and a transistor, said capacitive element comprising a ferroelectric film interposed between electrodes facing to each other, storing and retaining binary data in accordance with polarization of said ferroelectric film, one of a source and a drain of said transistor being electrically connected to one of said electrodes of said capacitive element, (b) a plurality of word lines each associated with each row of said memory cells, each of said word lines being electrically connected to gates of transistors included in memory cells disposed in a respective row, each of said word lines reducing said memory cells into a selected condition at a selection level, (c) a plurality of bit lines each associated with each column of said memory cells and being electrically connected to the other of a source and a drain of said transistors included in memory cells disposed in a respective column, (d) a plate line being electrically connected to the other of said electrodes of said capacitive elements included in said memory cells;
   (B) plate line voltage supplying means for supplying said plate line with an intermediate voltage which corresponds to a level intermediate between high and low levels among logic levels of said binary data;
   (C) precharging means for precharging said bit lines to a voltage which corresponds to one of said high and low levels among logic levels of said binary data before certain word lines are reduced into a selection level in response to an external address signal;
   (D) a plurality of sense amplifiers for comparing a signal read out of a selected memory cell to a bit line precharged by said precharging means with a reference level, and amplifying a difference therebetween;
   (E) bit line voltage retaining means for retaining said bit lines to be said intermediate voltage after amplification by said sense amplifiers has been completed; and
   (F) electrode voltage compensating means for reducing a voltage at a junction of said transistor and said capacitive element to be said intermediate voltage by reducing a certain word line into a selected level and activating a transistor of a memory cell connected to said certain word line while said bit lines are being retained to be said intermediate voltage by said bit line voltage retaining means.

2. The ferroelectric memory device as set forth in claim 1, wherein each of said bit lines comprises a pair of first and second bit lines, each of said memory cells comprises first and second memory cells in each of which said other of a source and a drain of said transistor is electrically connected to said first and second bit lines, respectively, each of said word lines comprises first and second word lines for reducing said first and second memory cells into a selected condition, and
   said ferroelectric memory device further comprising a reference level generating circuit for transmitting a reference level to one of said first and second bit lines forming a pair with the other to which a signal read out of a selected memory cell is transmitted.

3. The ferroelectric memory device as set forth in claim 2, wherein said sense amplifier amplifies a voltage difference between said first and second bit lines.

4. The ferroelectric memory device as set forth in claim 3, wherein said bit line voltage retaining means comprises (a) a balance circuit for balancing said first and second bit lines to be at the same voltage, and (b) an intermediate voltage supplying circuit for supplying said intermediate voltage to said first and second bit lines.

5. The ferroelectric memory device as set forth in claim 4, wherein said electrode voltage compensating means comprises word line selecting means for reducing said first and second word lines into a selected level in a certain period during said intermediate voltage supplying circuit supplies said intermediate voltage to said first and second bit lines.

6. A ferroelectric memory device comprising:
   (A) at least one memory cell array, said memory cell array including (a) a plurality of memory cells arranged in row and column direction, each of said memory cells having a capacitive element and a transistor, said capacitive element comprising a ferroelectric film interposed between electrodes facing to each other, storing and retaining binary data in accordance with polarization of said ferroelectric film, one of a source and a drain of said transistor being electrically connected to one of said electrodes of said capacitive element, (b) a plurality of word lines each associated with each row of said memory cells, each of said word lines being electrically connected to gates of transistors included in memory cells disposed in a respective row each of said word lines reducing said memory cells into a selected condition at a selection level, (c) plurality of bit lines each associated with each column of said memory cells and being electrically connected to the other of a source and a drain of said transistors included in memory cells disposed in a respective column, (d) a plate line being electrically connected to the other of said electrodes of said capacitive elements included in said memory cells;
   (B) plate line voltage supplying means for supplying said plate line with an intermediate voltage which corresponds to a level intermediate between high and low levels among logic levels of said binary data;
   (C) precharging means for precharging said bit lines to a voltage which corresponds to one of said high and low levels among logic levels of said binary data before certain word lines are reduced into a selection level in response to an external address signal;

(D) a plurality of sense amplifiers for comparing a signal read out of a selected memory cell to a bit line precharged by said precharging means with a reference level, and amplifying a difference therebetween;

(E) bit line voltage retaining means for retaining said bit lines to be said intermediate voltage after amplification by said sense amplifiers has been completed;

(F) electrode voltage compensating means for reducing a voltage at a junction of said transistor and said capacitive element to be said intermediate voltage by reducing a certain word line into a selected level and activating a transistor of a memory cell connected to said certain word line while said bit lines are being retained to be said intermediate voltage by said bit line voltage retaining means;

each of said bit lines comprises a pair of first and second bit lines, each of said memory cells comprises first and second memory cells in each of which said other of a source and a drain of said transistor is electrically connected to said first and second bit lines, respectively, each of said word lines comprises first and second word lines for reducing said first and second memory cells into a selected condition;

said ferroelectric memory device further comprising a reference level generating circuit for transmitting a reference level to one of said first and second bit lines forming a pair with the other to which a signal read out of a selected memory cell is transmitted;

said sense amplifiers amplifying a voltage difference between said first and second bit lines;

said bit line voltage retaining means comprising (a) a balance circuit for balancing said first and second bit lines to be at the same voltage, and (b) an intermediate voltage supplying circuit for supplying said intermediate voltage to said first and second bit lines;

said electrode voltage compensating means comprises word line selecting means for reducing said first and second word lines into a selected level in a certain period during which said intermediate voltage supplying circuit supplies said intermediate voltage to said first and second bit lines; and said word line selecting means comprises an address counter for transmitting an internal address signal, and an address switching circuit for selecting one of said extreme and internal address signals, said address switching circuit being adapted to select said internal address signal when an electrode voltage of said capacitive element is to be compensated for.

7. The ferroelectric memory device as set forth in claim 6, wherein said electrode voltage compensating means comprises a circuit which retains said bit lines at said intermediate voltage by said bit line voltage retaining means and activates transistors of all of said memory cells in a period except a precharge period in which said bit lines are precharged by said precharging means and a subsequent period in which a certain word line is on a selected level by said external address signal.

8. The ferroelectric memory device as set forth in claim 7, wherein said electrode voltage compensating means comprises a word line level control circuit for applying a certain voltage to all of said word lines, said certain voltage being higher than a sum of said intermediate voltage and a threshold voltage of said transistor.

9. The ferroelectric memory device as set forth in claim 1, wherein said intermediate voltage is a half of a source voltage.

10. The ferroelectric memory device as set forth in claim 5, wherein said electrode voltage compensating means reduces said first and second word lines into a selected level in turn by a certain number of word lines.

11. The ferroelectric memory device as set forth in claim 1, wherein a voltage of said plate line is arranged to be fixed.

12. The ferroelectric memory device as set forth in claim 7, wherein a voltage of said plate line is arranged to be fixed.

13. The ferroelectric memory device as set forth in claim 8, wherein a voltage of said plate line is arranged to be fixed.

14. A ferroelectric memory device comprising:

(A) at least one memory cell array, said memory cell array including (a) a plurality of memory cells arranged in row and column directions, each of said memory cells having a capacitive element and a transistor, said capacitive element comprising a ferroelectric film interposed between electrodes facing to each other, storing and retaining binary data in accordance with polarization of said ferroelectric film, one of a source and a drain of said transistor being electrically connected to one of said electrodes of said capacitive element, and (b) a plate line being electrically connected to the other of said electrodes of said capacitive element; and (B) means for arranging a voltage of said plate line to be fixed and activating said transistor so as to arrange a voltage at a junction of said transistor and said capacitive element to be the same as said voltage of said plate line.

15. The ferroelectric memory device as set forth in claim 14, wherein said voltage of said plate line is equal to a voltage which corresponds to a level intermediate between high and low levels among logic levels of said binary data.

16. The ferroelectric memory device as set forth in claim 15, wherein said voltage of said plate line is equal to a half of a source voltage.

* * * * *

UNITED STATES PATENT AND TRADEMARK OFFICE
CERTIFICATE OF CORRECTION

PATENT NO. : 5,671,174
DATED : September 23, 1997
INVENTOR(S) : Hiroki KOIKE

It is certified that error appears in the above-identified patent and that said Letters Patent is hereby corrected as shown below:

Column 15, line 48, delete "extreme" insert --external--.

Signed and Sealed this

Seventeenth Day of February, 1998

Attest:

BRUCE LEHMAN

Attesting Officer

Commissioner of Patents and Trademarks